(12) United States Patent
Ma et al.

(10) Patent No.: US 7,247,041 B2
(45) Date of Patent: Jul. 24, 2007

(54) LAND GRID ARRAY CONNECTOR

(75) Inventors: Hao-Yun Ma, Tu-Cheng (TW); Yu-Chen Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/491,669

(22) Filed: Jul. 24, 2006

(65) Prior Publication Data

US 2007/0020963 A1 Jan. 25, 2007

(30) Foreign Application Priority Data

Jul. 22, 2005 (TW) .............................. 94124860 A

(51) Int. Cl.
*H01R 13/64* (2006.01)
(52) U.S. Cl. ....................................... 439/247; 439/71
(58) Field of Classification Search ................ 439/247, 439/71–73
See application file for complete search history.

(56) References Cited

U.S. PATENT DOCUMENTS 5,204,565 A * 4/1993 Sekine et al. .................. 310/71
6,641,420 B2 * 11/2003 Blanchfield et al. ........ 439/247

* cited by examiner

*Primary Examiner*—Truc Nguyen
(74) *Attorney, Agent, or Firm*—Wei Te Chung

(57) ABSTRACT

A land grid array (LGA) connector (1) according to an embodiment of the present invention includes an insulative housing (2), a stiffener (3) coupled to the housing, and a plurality of ribs (23) projecting from a periphery edge of the housing. The stiffener defines an opening (31) for surrounding the housing. Each of the ribs has a base defining a mating surface (2321) and a mounting surface (2312). The stiffener is coupled to the housing by the rib mating surface abutting against a wall face (32) of the stiffener opening, and the rib mounting surface resting on a peripheral edge (320) of the stiffener that defines the opening. As such, a reliable coupling between the stiffener and the housing is achieved, thereby having no possibility of releasing the housing from the stiffener by an external, improper force.

14 Claims, 6 Drawing Sheets

LAND GRID ARRAY CONNECTOR

BACKGROUND OF THE INVENTION

1. Field of the Invention

The present invention relates to the art of electrical connectors, and more particularly to an land grid array (LGA) connector.

2. Description of the Related Art

One type of the LGA connectors 1' is shown in FIG. 5 for electrically connecting an IC package (not shown) and a printed circuit board (not shown). The LGA connector 1' typically includes an insulative housing 2' of a generally rectangular shape, a plurality of conductive terminals 6' held within the insulative housing 2', a stiffener 3' defining an opening 31' for grasping a periphery edge of the insulative housing 2', a pressing cover 5' and a lever 4' respectively attached to opposite ends of the stiffener 3' for cooperatively providing a downward force towards the IC package on the insulative housing 2' so as to effect a reliable interconnection between the IC package and the printed circuit board through the LGA connector 1'.

Typically, the insulative housing 2' is attached to the stiffener 3' by a plurality of tabs 23' projecting out from a peripheral edge of the insulative housing 2' that interferingly engages sidewalls of the stiffener 3'. A problem, however, with the LGA connector 1' is that the stiffener 3' is prone to be released from the insulative housing 2' if an external, improper force is applied thereto. This is so because the tab 23' of the insulative housing 2' interferingly engages the sidewall of the stiffener 3' by providing a planar surface, that is substantially parallel to that sidewall of the stiffener 3'. For most instances, parallel surfaces between two objects cannot form a reliable attachment therebetween. Therefore, this will often result in an un-reliable attachment between the insulative housing 2' and the stiffener 3'. In brief, it is understood that the reason why the housing 2' and the stiffener 3' engage each other with interference fit in a somewhat floating manner is to allow the vertical relative movement therebetween under a condition that the housing 2' is mounted to the printed circuit board via soldering between the contacts 6 and the printed circuit board, and the stiffener 3' is mounted to the printed circuit board via the fastening screws (not shown) extending through the screw holes 33'. Anyhow, such a floating manner may result in drop-off of the housing from the stiffener during delivery. Thus, how to achieve a floating manner between the housing and the stiffener for not only allowing respective mounting of the housing and the stiffener to the printed circuit board but also preventing drop-off of the housing from the stiffener during shipping, is an object of the invention.

SUMMARY OF THE INVENTION

A land grid array (LGA) connector according to an embodiment of the present invention includes an insulative housing of a substantially rectangular shape, a stiffener coupled to the insulative housing, and a plurality of ribs projecting from a periphery edge of the insulative housing. The stiffener defines an opening for surrounding the insulative housing. Each of the ribs has a base defining a first mating surface and a second mounting surface. The stiffener is coupled to the insulative housing by the rib mating surface of the insulative housing abutting against a wall face of the stiffener opening, and the rib second mounting surface at least partially resting on a peripheral edge of the stiffener that defines the opening. Thus, as compared with the prior art, a reliable coupling between the stiffener and the insulative housing is achieved, thereby having no possibility of releasing the insulative housing from the stiffener by an external, improper force.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
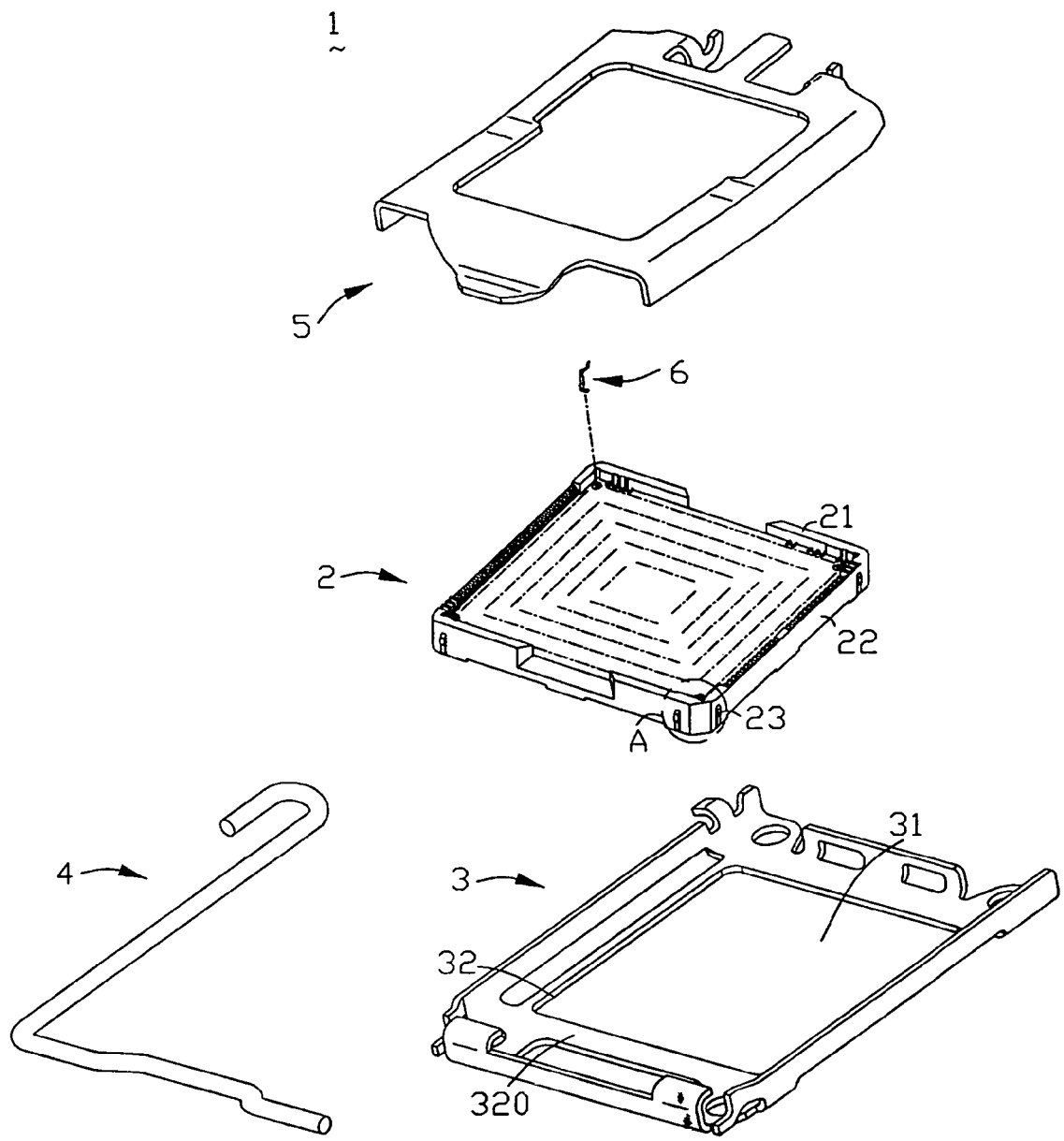
FIG. 1 is an exploded, perspective view of an LGA connector according to a preferred embodiment of the present invention.
Figure 2:
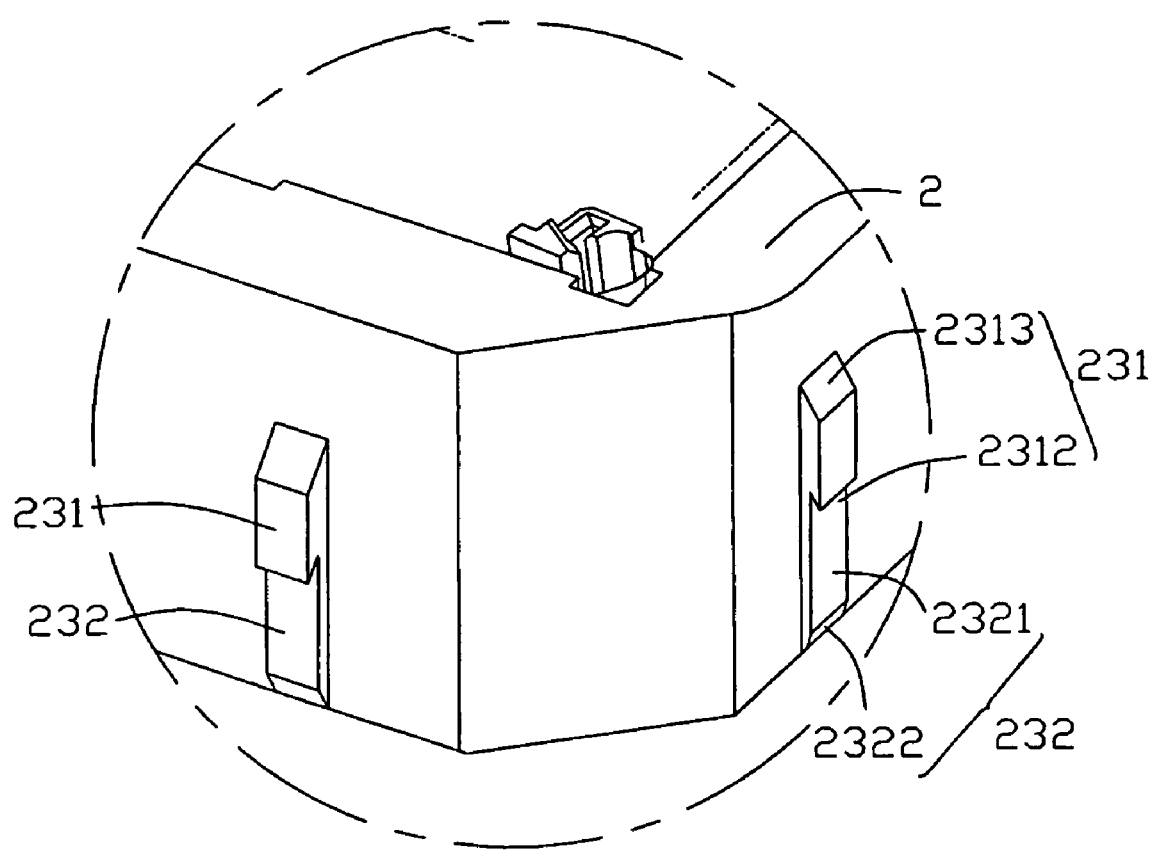
FIG. 2 is an enlarged view of a circle part A of the LGA connector contact of FIG. 1.
Figure 3:
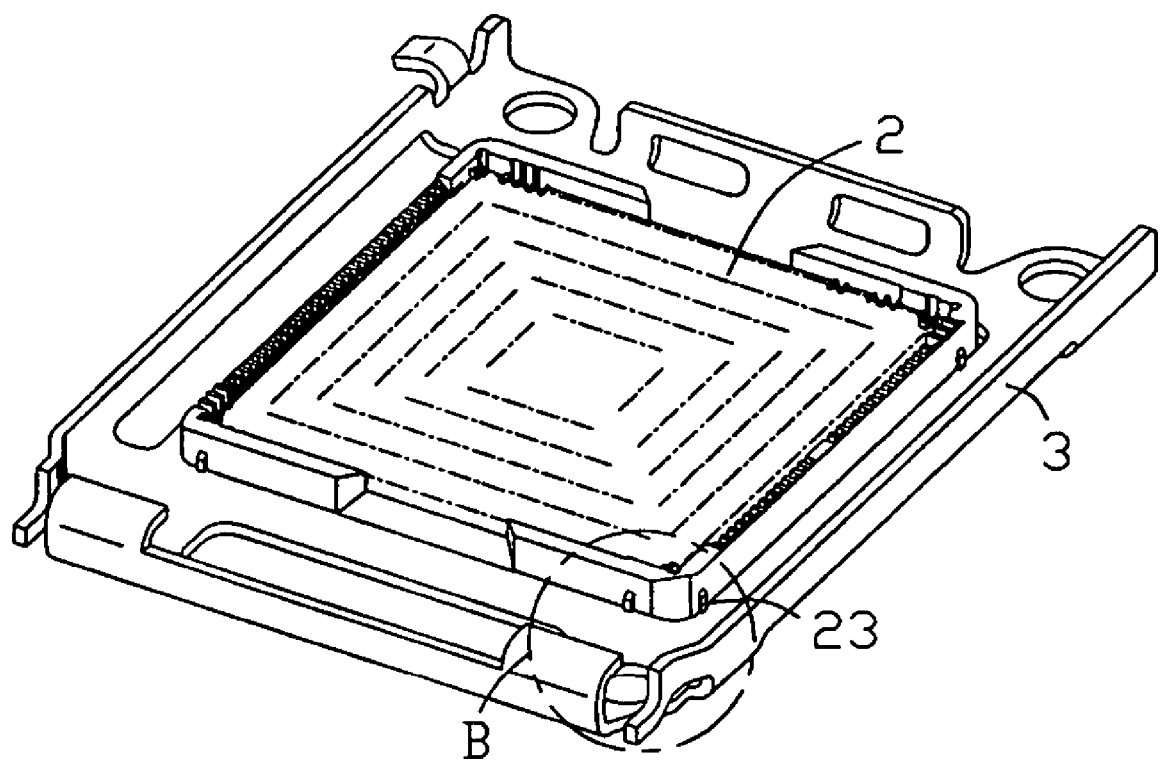
FIG. 3 is an assembled, perspective view of the LGA connector of FIG. 1, but with a pressing cover and a lever removed therefrom.
Figure 4:
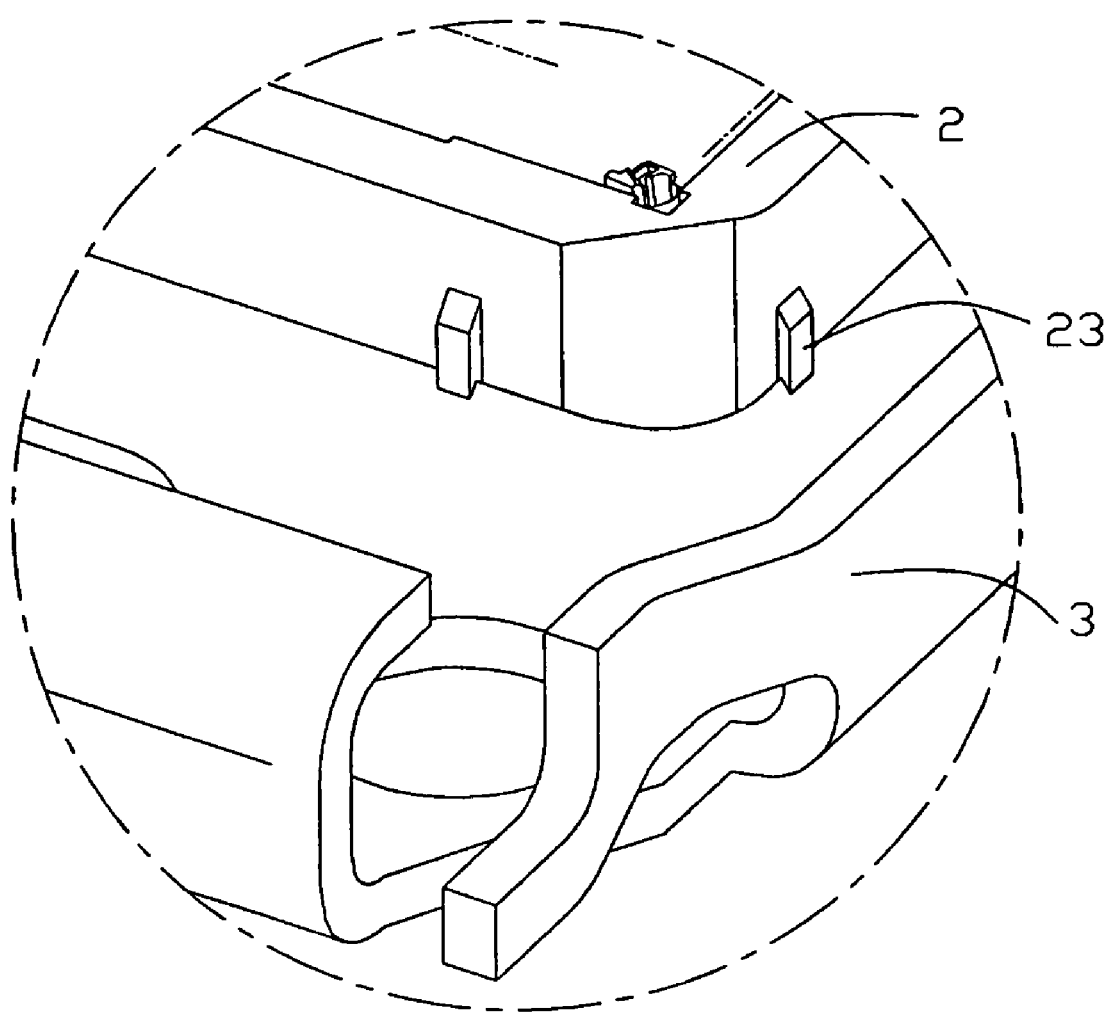
FIG. 4 is an enlarged view of a circle part B of the LGA connector of FIG. 3.

Referring to FIGS. 1 to 5, an LGA connector 1 according to the preferred embodiment of the present invention is shown for electrically connecting an IC package (not shown) and a printed circuit board (not shown). The LGA connector 1 includes an insulative housing or body 2 of a generally rectangular shape, a plurality of conductive terminals 6 held within the insulative housing 2, a stiffener 3 defining an opening 31 for surrounding a periphery edge of the insulative housing 2, and a retention structure attached to the stiffener 3 for providing a downward force towards the IC package on the insulative housing 2 so as to establish a reliable interconnection between the IC package and the printed circuit board through the LGA connector 1. In this embodiment, the retention structure includes a pressing cover 5 and a lever 4 respectively attached to opposite ends of the stiffener 3.

The insulative housing 2 further includes a plurality of projections or ribs 23 projecting outwardly from the periphery edge of the insulative housing 2. The projections 23 are located around each corner of the insulative housing 2. In this embodiment, the insulative housing 2 includes a pair of projections 23 respectively extending from two intersecting sides 21, 22 of the insulative housing corner. It should be noted that, in other embodiments, the projections 23 of the insulative housing 2 might have any suitable number and/or other configuration depending on various applications.

Each of the projections 23 includes a base including a large mounting portion 231 and a small mating portion 232. The mounting portion 231 is longitudinally spaced from the mounting portion 231, and configured to extend much more outwardly from the peripheral edge of the insulative housing 2 than the mating portion 232. The mating portion 232 defines a front mating surface 2321, while the mounting portion 231 defines a bottom mounting surface 2312 that intersects with the front mating surface 2321 of the mating portion 232. In this embodiment, the bottom mounting surface 2312 of the mounting portion 231 is substantially perpendicular to the front mating surface 2321 of the mating portion 232. In addition, the mounting portion 231 includes a first lead-in surface 2313, and said mating portion 232 includes a second lead-in surface 2322. The first lead-in surface 2313 is located at an end of the projection 23 opposite to the location of the second lead-in surface 2322. Further, the first lead-in surface 2312 is beveled towards an opposite direction to the second lead-in surface 2322.

The stiffener 3 is interferingly coupled to the insulative housing 2 with sidewalls for surrounding the insulative housing 2, such that the mating portion 232 of each projection 23 of the insulative housing 2 extends substantially to a corresponding lateral sidewall 32 of the stiffener 3 while not across the lateral sidewall 32 of the stiffener 3, and the mounting portion 231 is at least partially retained on a region 320 of the stiffener 3 adjacent that lateral sidewall 32 so as to enable a reliable coupling between the stiffener 3 and the insulative housing 2. As such, the projection mating surface 2321 of the insulative housing 2 is adapted to abut against the sidewall face 32 of the stiffener opening 31, while the second mounting surface 2312 is adapted for at least partially resting on the region 320 of the stiffener 3 proximate to the sidewall face 32 of the stiffener 3 that defines the opening 31. As compared with the prior art, the stiffener 3 is securely held on the insulative housing 2 by these un-parallel surfaces between the insulative housing 2 and the stiffener 3.

Figure 5:
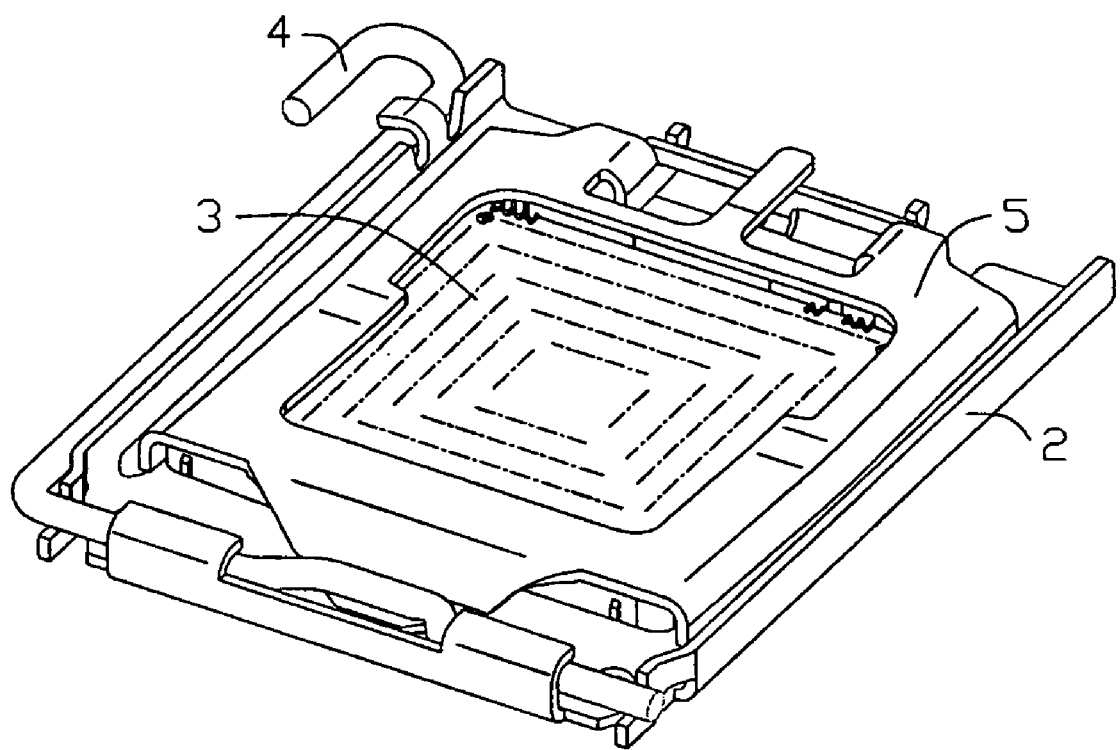
FIG. 5 is an assembled, perspective view of the LGA connector of FIG. 1, with a pressing cover and a lever attached thereto.
Figure 6:
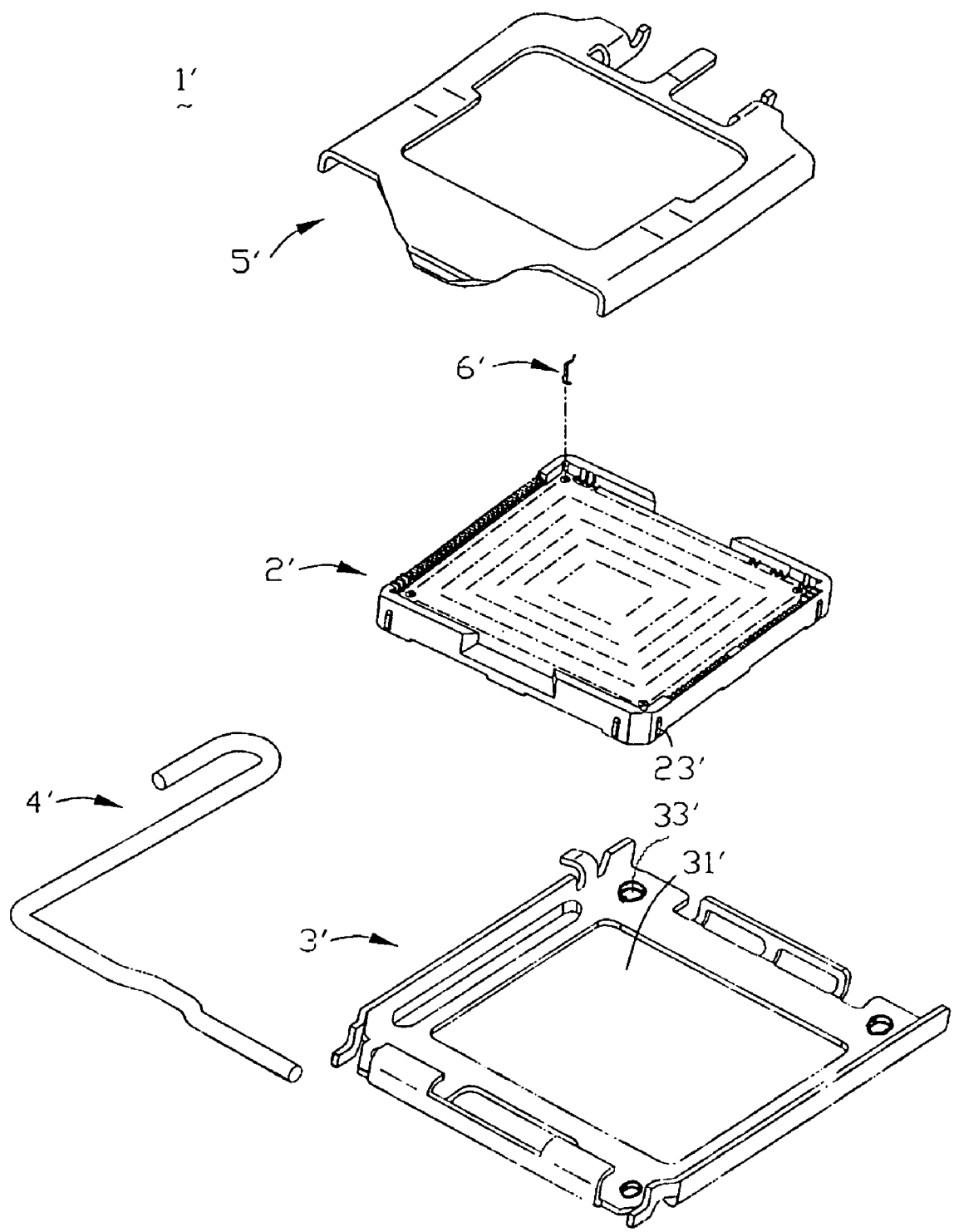
FIG. 6 is an exploded, perspective view of a conventional LGA connector.

Referring to FIGS. 1 and 5, in assembly, the plurality of terminals 6 is pre-loaded within the insulative housing 2. The insulative housing 2 is then assembled to the stiffener 3 by the projection mating surface 2321 abutting against the wall face 32 of the stiffener opening 31, and the second mounting surface 2312 at least partially resting on the region 320 of the stiffener 3 proximate to the sidewall face 32 of the stiffener 3 that defines the opening 31. The pressing cover 5 and the lever 4 are attached to the opposite ends of the stiffener 3. As such, a reliable coupling between the stiffener 3 and the insulative housing 2 is achieved, thereby having no possibility of releasing the insulative housing 2 from the stiffener 3 by an external, improper force.

While the present invention has been described with reference to preferred embodiments, the description of the invention is illustrative and is not to be construed as limiting the invention. Various of modifications to the preferred embodiments by those skilled in the art without departing from the true spirit and scope of the invention as defined by the appended claims.

What is claimed is:

1. A land grid array (LGA) connector comprising:
   an insulative housing of a substantially rectangular shape, the insulative housing defining a peripheral edge;
   a stiffener coupled to the insulative housing and having an opening for surrounding the insulative housing; and
   a plurality of ribs projecting from the periphery edge of the insulative housing, each rib having a base defining a first mating surface and a second mounting surface;
   the first mating surface of the rib of the insulative housing adapted to abut against an inner wall face of the stiffener opening, and the second mounting surface adapted for at least partially resting on a peripheral edge of the stiffener that defines the opening so as to enable the coupling between the stiffener and the insulative housing;
   wherein each of the ribs is an inverse L-shaped projecting downwardly from the periphery edge;
   wherein the mating surface is on the downwardly portion of the inverse L-shaped.

2. The LGA connector as recited in claim 1, wherein the plurality of ribs is located around each corner of the insulative housing.

3. The LGA connector as recited in claim 2, wherein each corner of the insulative housing includes a pair of ribs respectively extending from two intersecting sides of said corner of the insulative housing.

4. The LGA connector as recited in claim 1, further comprising a retention structure, the retention structure adapted for providing an external force imparted on an IC package so as to effect a reliable interconnection between the IC package and the LGA connector when the IC package is retained within the insulative housing of the LGA connector.

5. The LGA connector as recited in claim 4, wherein the retention structure comprises a pressing cover and a lever respectively attached to opposite ends of the stiffener for cooperatively pressing the IC package on the insulative housing.

6. An electrical connector comprising:
   an insulative body of a substantially rectangular shape, the body having a plurality of projections extending outwardly of a peripheral edge of the insulative body;
   at least one of the projections including a mounting portion and a mating portion longitudinally spaced from the mounting portion;
   a stiffener interferingly coupled to the insulative body, the stiffener having sides for surrounding the insulative body such that the mating portion of the insulative body extends substantially to a corresponding lateral inner surface of the side of the stiffener while not across said lateral side of the stiffener, and the mounting portion is retained on a region of the stiffener adjacent said lateral side so as to enable the coupling between the stiffener and the insulative body;
   wherein each of the projections is an inverse L-shaped;
   wherein the mating surface is on the downwardly portion of the inverse L-shaped and adapted to abut against the inner surface of the side.

7. The LGA connector as recited in claim 6, wherein said at least one of the projections is located around each corner of the insulative body.

8. The LGA connector as recited in claim 7, wherein each corner of the insulative body includes a pair of said at least one of the projections, said pair of projections respectively extending from two intersecting sides of said corner of the insulative body.

9. The LGA connector as recited in claim 6, wherein said mounting portion includes a first lead-in surface, and said mating portion includes a second lead-in surface, the first lead-in surface being located in an end of said at least one of the projections opposite to the location of the second lead-in surface.

10. The LGA connector as recited in claim 6, further comprising a pressing cover and a lever respectively attached to opposite ends of the stiffener for cooperatively pressing an IC package on the insulative housing so as to effect a reliable interconnection between the IC package and the LGA connector when the IC package is retained within the insulative housing of the LGA connector.

11. A floating type socket comprising:
    an insulative housing defining a periphery wall and a plurality of passageways extending along a vertical direction;

a plurality of contacts disposed in the corresponding passageways, respectively;

a metallic stiffener defining an center opening receiving said housing therein; and a pressing cover attached to and moveable relative to the stiffener so as to block upward movement of the housing relative to the stiffener when said pressing cover is located in a closed position during delivery; wherein the housing is moveable relative to the stiffener in a floating manner while at least one projection is formed on the periphery wall which is adapted to be seated upon the stiffener around said opening for preventing downward drop-off of the housing from the stiffener during delivery;

wherein projection is an inverse L-shaped which includes a mating surface and a mounting surface;

wherein the mating surface is downwardly projection from the periphery wall adapted to abut against an inner wall face of the opening;

wherein the mounting surface is adapted to be seated on the stiffener around the opening.

12. The socket as claimed in claim 11, wherein said housing defines at least one rib on the periphery wall and said step is formed on said rib.

13. The socket as claimed in claim 12, wherein said housing defines at least one rib on the periphery wall which interferes with the stiffener in the opening.

14. The socket as claimed in claim 11, wherein the stiffener has the securing device for being independently secured to a printed circuit board.

* * * * *